United States Patent [19]
Hooper et al.

[11] Patent Number: 6,146,458
[45] Date of Patent: Nov. 14, 2000

[54] MOLECULAR BEAM EPITAXY METHOD

[75] Inventors: Stewart Edward Hooper, Oxford; Alistair Henderson Kean, Stadhampton; Geoffrey Duggan, Deddington, all of United Kingdom

[73] Assignee: Sharp Kabushiki Kaisha, Osaka, Japan

[21] Appl. No.: 09/041,269

[22] Filed: Mar. 12, 1998

[30] Foreign Application Priority Data

Mar. 13, 1997 [GB] United Kingdom .................. 9705233

[51] Int. Cl.⁷ ................................................ C30B 25/14
[52] U.S. Cl. ........................ 117/106; 117/108; 117/200; 118/723 VE
[58] Field of Search .................................. 117/200, 108, 117/106; 118/723 VE

[56] References Cited

U.S. PATENT DOCUMENTS

| | | | |
|---|---|---|---|
| 4,870,032 | 9/1989 | Johnston, Jr. et al. | 437/84 |
| 5,599,732 | 2/1997 | Razeghi | 117/108 |
| 5,637,146 | 6/1997 | Chyi | 117/200 |
| 5,637,531 | 6/1997 | Porowski et al. | 117/952 |
| 5,831,277 | 11/1998 | Razeghi | 257/15 |
| 5,874,747 | 2/1999 | Redwing et al. | 438/107 |

FOREIGN PATENT DOCUMENTS

| | | |
|---|---|---|
| 0540304 | 5/1993 | European Pat. Off. . |
| 0565455 | 10/1993 | European Pat. Off. . |
| 0633331 | 1/1995 | European Pat. Off. . |
| 59-57997 | 3/1984 | Japan . |
| 1249692 | 10/1989 | Japan . |
| 2066299 | 7/1981 | United Kingdom . |
| 9731140 | 8/1997 | WIPO . |

OTHER PUBLICATIONS

Search Report for Application No. GB 9705233.6; Dated May 22, 1997.

S. Nakamura et al., Appl. Phys. Lett., vol. 58, No. 18, pp. 2021–2023, 1991, "Novel Metalorganic Chemical Vapor Deposition System for GaN Growth".

S. S. Liu et al., J. Electrochem. Soc., vol. 125, No. 7, pp. 1161–1169, 1978, "Growth Kinetics and Catalytic Effects in the Vapor Phase Epitaxy of Gallium Nitride".

S. Strite et al., Handbook of Thin Film Process Technology, A2.4, 1–25, 1995, "Thin Film Deposition and Dopant Incorporation by Energetic Particle Sources".

M. Kamp et al., Proceedings of Materials Research Society Fall Meeting, pp. 1–4, 1995, "Thermally Cracked NH3 for MBE Growth of GzN".

M. Kamp et al., Proceedings of Topical Workshop on III–V Nitrides, 1995, "NH3 as Nitrogen Source in MBE Growth of GaN".

M. Taneya et al., Japanese Journal of Applied Physics, vol. 28, No. 3, pp. L515–L517, 1989, "Electro–Beam–Induced C12 Etching of GaAs".

M. Taneya et al., J. Appl. Phys., vol. 67, No.9, pp. 4297–4303, 1990, "Novel Electron–Beam Lithography for in situ Patterning of GaAs Using an Oxidized Surface Thin Layer as a Resist".

(List continued on next page.)

*Primary Examiner*—Robert Kunemund
*Attorney, Agent, or Firm*—Renner, Otto, Boisselle & Sklar, LLP

[57] ABSTRACT

A method of growing a layer of Group III nitride material on a substrate by molecular beam epitaxy includes the steps of (i) disposing a substrate in a vacuum chamber, (ii) reducing the pressure in the vacuum chamber to a pressure suitable for epitaxial growth by molecular beam epitaxy, (iii) supplying ammonia through an outlet of a first supply conduit into the vacuum chamber so that the ammonia flows towards the substrate; and (iv) supplying a Group III element in elemental form through an outlet of a second supply conduit into the vacuum chamber so that said Group III element flows towards the substrate. The method causes a layer containing Group III nitride to be grown on the substrate by molecular beam epitaxy. In the method, the outlet of the first supply conduit is disposed nearer to the substrate than the outlet of the second supply conduit.

15 Claims, 1 Drawing Sheet

OTHER PUBLICATIONS

M. Knudsen, Ann. Phys., vol. 4, No. 48, pp. 1113–1121, 1915, "The Cosine Law in the Kinetic Theory of Gases".

Search Report for Application No. 98301842.5–2104–; Dated Mar. 19, 1999 (EPO).

Z. Yang et al.; J. Vac. Sci. Technol. B 14(3); May/Jun. 1996; pp. 2354–2356; "High–Quality GaN and AIn Grown by Gas–Source Molecular Beam Epitaxy Using Ammonia as the Nitrogen Source".

Yang et al., "GaN grown by molecular beam epitaxy at high growth rates using ammonia as the nitrogen soruce", Appled Physics Letters, vol. 67(12) pp. 1686–88, Sep. 18, 1995.

MOLECULAR BEAM EPITAXY METHOD

This invention relates to a molecular beam epitaxy (MBE) method for the epitaxial growth of Group III nitride semiconductor materials, such as GaN.

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

BACKGROUND OF INVENTION

CVD (or VPE) takes place in an apparatus which is commonly at atmospheric pressure but sometimes at a slightly reduced pressure of typically about 10 KPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria. To improve epitaxial growth of gallium nitride using the CVD process, it has been proposed in Appl. Phys. Lett. 58, (18), 6 May 1991, pages 2021–2023, to use a sub-flow of inactive gas perpendicular to the substrate for the purpose of changing the direction of the main flow of gaseous reactants across the substrate so as to bring the reactant gas into contact with the substrate. However, even such a modified CVD technique requires high growth temperatures to promote a high quality epitaxial deposit with all the attendant disadvantages of high growth temperatures, such as liberation of unwanted contaminants and increased evaporation of deposited material from the substrate.

Another form of CVD (or VPE) apparatus for the epitaxial growth of gallium nitride is disclosed in J. Electrochem. Soc., 125, (1978), pages 1161–1169, which discloses the catalytic activity of gallium and gallium nitride on the decomposition of ammonia. In such apparatus, hydrogen chloride is passed over gallium contained in a boat in a source zone of a furnace so as to produce gallium chloride which is passed through a furnace centre zone at which ammonia is introduced. The gallium chloride and ammonia then pass into a deposition zone of the furnace at which the substrate is mounted so that epitaxial growth can take place by vapour phase epitaxy with the gallium or gallium nitride assisting in the vapour phase decomposition of the ammonia to form nitrogen.

An appreciation of the basic differences between CVD (or VPE) and MBE will be well understood by those skilled in the art. Essentially, in the case of MBE as applied to the GaN system, an ultra-high vacuum (UHV) environment, typically about $1\times10^{-3}$ Pa is used with a relatively low substrate temperature, typically about 750° C., and with ammonia or another nitrogen precursor being supplied to the MBE chamber by means of a supply conduit and species providing gallium and, possibly, indium and/or aluminium being supplied from appropriate sources within heated effusion cells fitted with controllable shutters to control the amounts of the species supplied into the MBE chamber during the epitaxial growth period. The shutter-controlled outlets from the effusion cells and the nitrogen supply conduit face the surface of the substrate upon which epitaxial growth is to take place. The ammonia and the species supplied from the effusion cells travel across the MBE chamber and reach the substrate where epitaxial growth takes place in a manner which is driven by the deposition kinetics.

Various proposals have been made for improving epitaxial growth of gallium nitride by MBE. For example, S. Strite et al, in section A 2.4, Handbook of Thin Film Process Technology, edited by D. A. Glocker et al, Institute of Physics (1995), disclose plasma-enhanced MBE of gallium nitride so as to convert molecular nitrogen into its atomic form necessary for growth. However, only small useful ratios of nitrogen to gallium are possible using plasma sources. M. Kamp et al in Proceedings of Materials Research Society fall meeting, Boston USA (1995), pages 1–4, and M. Kamp et al in Proceedings of Topical Work Shop on III–V Nitrides, Nagoya, Japan (1995), disclose a technique referred to as On-Surface Cracking (OSC) for inducing thermal cracking of ammonia using what is essentially a typical MBE reactor and system for introduction of ammonia, but where the ammonia introduction nozzle is kept at a relatively low temperature whilst employing a relatively high temperature (typically 800° C.) at the substrate to achieve the best gallium nitride crystal properties.

GB-A-2066299 discloses a method for growing doped III–V alloy layers by molecular beam epitaxy where the Group III species (Ga and/or In) and the Group V species (As and/or P) are supplied into a vacuum chamber by respective effusion cells which are arranged to discharge into the interior of a shroud which is disposed within the vacuum chamber and which is fitted with a shutter between the cells and the substrate on which epitaxial growth is to take place. The cells for the Group V species are longer than the cells for the Group III species and have two heating zones.

EP-A-0633331 and EP-A-0565455 disclose processes for preparing a high crystallinity oxide superconductor film (eg a Y—Ba—Cu—O type film) by molecular beam epitaxy. In such process, the metal species are supplied from effusion cells to the substrate through an apertured partitioning plate whilst oxygen and ozone are supplied in the vicinity of the substrate via gas-introducing nozzle.

EP-A-0540304 discloses a method for the manufacture of a Group II–VI compound semiconductor containing nitrogen as an impurity (dopant). The nitrogen is supplied in relatively small amounts using a supply which is remote from the substrate, which produces nitrogen excitation species (eg $N^+$, $N_2^+$ and N) from gaseous nitrogen, and which discharges these species as a beam towards the substrate.

Patent Abstracts of Japan, Vol 13, No 592 [C-671] (JP-A-1-249692) discloses a molecular beam epitaxy device in which a Group V evaporation source, such as an As evaporation source, is disposed nearer to the substrate than the other evaporation sources to prevent wasteful scattering of the molecular beam.

U.S. Pat. No. 5,637,146, published on 10 Jun. 1997, discloses a method for the growth of semiconducting Group III nitrides, such as GaN, InN and AlN and their alloys, by molecular beam epitaxy. In such method, the source of nitrogen is atomic nitrogen produced by dissociation of high purity nitrogen using an RF excited plasma source or a nitrogen thermal cracker. The source of atomic nitrogen is separated from a substrate manipulator by a distance of less than 15 cm to produce a high nitrogen atom flux and thus a high growth rate. The Group III species is supplied as an organometallic compound via a gas injector which is disposed between the source of atomic nitrogen and the substrate manipulator, and which is thus nearer to the latter than the atomic nitrogen source.

It is an object of the present invention to provide an improved method of epitaxially growing a Group III nitride material by molecular beam epitaxy.

SUMMARY OF THE INVENTION

According to the present invention, there is provided a method of growing a layer of Group III nitride material on a substrate by molecular beam epitaxy, comprising the steps of:

(i) disposing a substrate in a vacuum chamber;

(ii) reducing the pressure in the vacuum chamber to a pressure suitable for epitaxial growth by molecular beam epitaxy;

(iii) supplying ammonia through an outlet of a first supply conduit into the vacuum chamber so that the ammonia flows towards the substrate; and (iv) supplying a Group III element in elemental form through an outlet of a second supply conduit into the vacuum chamber so that said Group III element flows towards the substrate, whereby to cause a layer containing a Group III nitride to be grown on the substrate by molecular beam epitaxy;

characterised in that the ammonia outlet is disposed nearer to the substrate than the outlet of the second supply conduit.

The present invention may thus enable positioning of the outlet of the supply conduit close as possible to the growth surface, thereby permitting the local ammonia flux to be maximized in the region of the growth surface consistent with obtaining a uniform flux over the area of the substrate, whilst avoiding keeping the outlet so close as to cause the temperature at the outlet end of the first supply conduit to reach that at which there is significant ammonia decomposition within the outlet end of the first supply conduit. Such temperature is typically about 600° C. Thus, it is preferred to position the ammonia outlet and the flow of ammonia such that the temperature at the outlet does not exceed about 600° C. and such that the ammonia vapour pressure at the substrate is 1 to $10^{-7}$ Pa ($10^{-2}$ to $10^{-9}$ mbar), depending upon the pressure to which the vacuum pressure is evacuated. This may be facilitated by mounting the ammonia outlet so that its position relative to the substrate can be varied before or even during a particular epitaxial growth period.

Preferably, pressure reduction in step (ii) is effected using an exhaust outlet which is disposed within the vacuum chamber adjacent to the substrate so as to ensure proper removal of reaction products from the region of the substrate.

The method of the present invention allows a high vacuum to be maintained within the vacuum chamber as a whole, thereby permitting high vacuum compatible equipment, e.g. effusion cells, to be used in the same vacuum chamber. In this regard, it is to be appreciated that the first supply conduit supplies ammonia which is required to be present in excess for the molecular beam epitaxial growth step, and that a conventionally positioned effusion cell may define the second supply conduit for supplying the Group III element in elemental form. This mitigates the problem of introducing impurities which can arise in cases where the Group III element is supplied to the vacuum chamber in the form of an organometallic gas which decomposes in the vacuum chamber to provide the Group III element.

The ammonia outlet can thus be positioned at a location at which it does not mask the substrate from the Group III element outlet.

As many additional effusion cells as are necessary for the particular epitaxial growth procedure being undertaken may be provided for supplying other species into the vacuum chamber. Thus, the method according to the present invention may also involve the supply of further species, preferably in elemental form, through one or more further supply conduits.

The end of the first supply conduit which defines the ammonia outlet may have a single opening or orifice, or it may have more than one opening or orifice, e.g. an array of openings or orifices in the manner of a shower head.

In a first embodiment, the ammonia is discharged through the ammonia outlet towards the substrate in a direction which is transverse, preferably perpendicular, to that surface of the substrate on which epitaxial growth is to take place. This assists in ensuring that there is a uniform flux of the species over the area of the substrate. In this embodiment, the outlet of the first supply conduit is preferably spaced from said surface of the substrate by a distance x such that $0.1\alpha < x < 0.7\alpha$, where $\alpha$ is the distance between the surface of the substrate and the outlet of the second supply conduit. More preferably, $0.2\alpha < x < 0.5\alpha$, and most preferably x is about $0.4\alpha$.

In a second embodiment, the ammonia is discharged across the surface of the substrate. This can be conveniently provided by arranging for the outlet of the first supply conduit to be disposed adjacent one side edge of the substrate in use. Preferably, the outlet of the first supply conduit is spaced from said side edge of the substrate by a distance y such that $0.0\beta < y < 0.7\beta$, where $\beta$ is the distance between said edge of the substrate and an adjacent wall of the vacuum chamber. More preferably, $0.1\beta < y < 0.3\beta$, and most preferably y is about $0.1\beta$.

The flow rate of the species (e.g. ammonia) being supplied through the supply conduit may be up to up to 10000 sccm (standard cm$^3$/min) and depends upon the size of the apparatus.

It is particularly preferred for the vacuum chamber to be connected via said at least one vacuum outlet to a pump arrangement which pumps at a rate (e.g. 500–200,000 ls$^{-1}$, depending upon the size of the apparatus) such as to maintain an ultra-high vacuum within the chamber, whilst allowing a high ammonia flux at the substrate. The overall pressure to which the vacuum chamber is evacuated may be about $10^{-1}$ to $10^{-9}$ Pa and is typically about $10^{-3}$ Pa. Thus, typically when the vacuum chamber is at an overall pressure of about $10^{-1}$ Pa, the vapour pressure of ammonia at the substrate may be about 1 Pa, but when the vacuum chamber is at an overall pressure of about $10^{-9}$ Pa, the vapour pressure of ammonia at the substrate may be about $10^{-7}$ Pa. Thus, typically the ammonia vapour pressure at the substrate may be about 10 to 100 times that of the overall pressure in the vacuum chamber.

The vacuum outlet or at least one of such outlets to the vacuum chamber is preferably defined by an exhaust conduit which extends into the vacuum chamber, preferably to such an extent that the vacuum outlet is disposed adjacent a side edge of the substrate in use. The distance between the outlet and the substrate is typically less than 20 cm. The distance z between the vacuum outlet and the side edge of the substrate is preferably such that $0.0\gamma < z < 1.0\gamma$, where $\gamma$ is the distance between said side edge of the substrate and an adjacent wall of the vacuum chamber. More preferably, $0.1\gamma < z < 0.3\gamma$, and most preferably z is about $0.1\gamma$.

The exhaust conduit preferably extends in a direction which is substantially parallel to and aligned with the surface of the substrate upon which epitaxial growth is to take place in use. In the case where the ammonia supply conduit is disposed adjacent one side edge of the substrate as in the second embodiment described above, it is preferred for the vacuum outlet or at least one of the vacuum outlets to be disposed adjacent an opposite side edge of the substrate so as to face the outlet end of the ammonia supply conduit.

According to another aspect of the present invention, there is provided an apparatus which is constructed and adapted to carry out the method according to the present invention, said apparatus comprising a vacuum chamber; a support arranged to support the substrate at a location within the vacuum chamber; at least one vacuum outlet to said chamber, and first and second supply conduit having respective outlets opening into the vacuum chamber, said first supply conduit serving to supply a flow of ammonia towards the substrate in use, and said second supply conduit serving to supply a Group III element in elemental form, wherein the outlet of the first supply conduit is disposed nearer to said location than the outlet of the second supply conduit.

Embodiments of the present invention will now be described, by way of example, with reference to the accompanying drawing, in which:

DETAILED DESCRIPTION OF INVENTION

Figure 1:
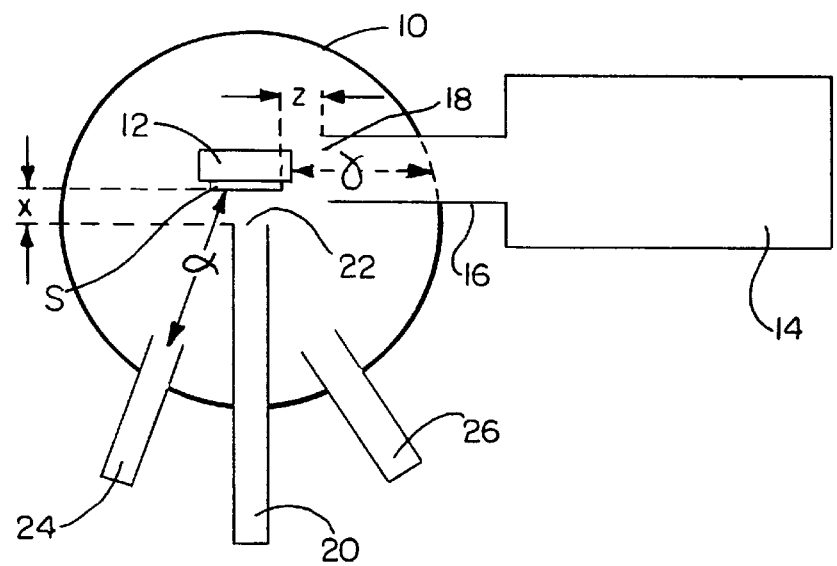
FIG. 1 is a schematic view of a research-type molecular beam epitaxy apparatus for carrying out the method according to the present invention.

Referring now to FIG. 1, the apparatus is for the epitaxial deposition of GaN-type semiconductor material by molecular beam epitaxy in a research system and comprises a vacuum chamber 10 in which is disposed a heated support 12 arranged to support and heat a substrate S. The vacuum chamber 10 is connected with an ultra-high vacuum pump 14 via an exhaust conduit 16 which extends into the vacuum chamber 10. The inner end of the exhaust conduit 16 defines a vacuum outlet 18 of the vacuum chamber 10. Such vacuum outlet 18 is disposed adjacent to the substrate support 12. In this particular embodiment, the vacuum outlet 18 is spaced a distance z of about 30 mm from the adjacent side edge of the substrate S on the support 12 so that the exhaust conduit 16 extends in a directin substantially parallel to the plane of the surface of the substrate S upon which epitaxial growth is to take place. This distance z represents about $0.1\gamma$, where $\gamma$ is the distance between said adjacent side edge of the substrate S and the adjacent wall of the vacuum chamber 10.

The vacuum chamber 10 is also provided with a first supply conduit 20 which, in accordance with the present invention, extends into the vacuum chamber so that an outlet 22 of the first supply conduit 20 is adjacent to and faces the surface of the substrate S upon which epitaxial growth is to take place. The first supply conduit 20 is adjustably mounted relative to the chamber 10 so that the relatively small distance x between the outlet 22 of the first supply conduit 20 and the epitaxial growth surface of the substrate S can be varied during the epitaxial growth period. As can be seen from FIG. 1, the longitudinal axis of the first supply conduit 20 is perpendicular to the plane of epitaxial growth.

The first supply conduit 20 is used to supply ammonia which is precursor of the nitrogen required in the epitaxial growth process. Because of the positioning of the outlet 22 of the first supply conduit 20 relatively close to the substrate S, a relatively high ammonia vapour pressure is localised at the surface of the epitaxially growing material whilst enabling an ultra-high vacuum environment within the vacuum chamber 10 to be achieved by the pump 14 communicating with the vacuum chamber 10 via the exhaust conduit 16.

The apparatus further comprises a pair of independently operable, shutter-controlled effusion cells 24 and 26 which contain sources of elemental gallium and another element (eg aluminium or dopant) which may be required during the epitaxial growth procedure. The effusion cells 24 and 26 are conventionally positioned and define second and further supply conduits respectively. These last-mentioned supply conduits extend into the vacuum chamber by only a relatively small amount compared to the first supply conduit 20. Thus, the outlets to the supply conduits defined by the effusion cells 24 and 26 are each spaced from the surface of the substrate S by a distance $\alpha$ of about 250 mm which is a conventional distance for this type of apparatus and which is greater than the distance x referred to above for the outlet 22. In this particular embodiment, x is about 100 mm (about $0.4\alpha$).

The use of the apparatus described above to grow a GaN film by molecular beam epitaxy in a research system will now be described.

Substrate S, which may, for example, be of sapphire SiC, GaAs, ZnO, Si, MgO, LiGaO$_2$, LiAlO$_2$ or In$_x$Al$_y$Ga$_{1-x-y}$N (where $0 \leq x \leq 1$, $0 \leq y \leq 1$ and $x+y \leq 1$) is heated to a temperature of about 750° C. (although it may be at a temperature of about 200–1500° C., more preferably about 550–850° C.) by means of the heated support 12, and the vacuum chamber 10 is evacuated to a pressure of about $10^{-3}$ Pa (although it may be in the range of from $10^{-2}$ to $10^{-9}$ Pa). Ammonia gas is caused to flow through the first supply conduit 20 into the vacuum chamber 10 at a flow rate of about 10 sccm (although it may be 2–15 sccm), which is higher than that which would normally be used for the ammonia flow rate in molecular beam epitaxial growth. The pump 14 is operated at a pumping speed of about 5000 ls$^{-1}$ (although it may be 2000–6000 ls$^{-1}$), which is several times that typically used for molecular beam epitaxy so as to permit the higher than usual flow rate of ammonia whilst maintaining the ultra-high vacuum with the chamber 10. This, together with the location of the outlet 22 of the first supply conduit 20 relatively near to the substrate S, ensures a significant increase in the effective ammonia flux localised at the growth surface as compared to a conventional molecular beam epitaxy method.

The distance x between the outlet 22 of the first supply conduit 20 and the growth surface on the substrate S can be adjusted in real time during the epitaxial growth process in such a way as to allow optimisation of ammonia flux uniformity across the substrate S and to prevent possible overheating of the inner end of the first supply conduit 20 at elevated growth temperatures.

Gallium is controllably supplied in elemental form in a manner known per se from the effusion cell 24 by appropriate control of the shutter associated therewith to enable epitaxial growth of GaN. The cell 26 can be used to supply aluminium or indium or a dopant in elemental form for incorporation into the epitaxial growth material as necessary in a manner which is well known per se.

Figure 2:
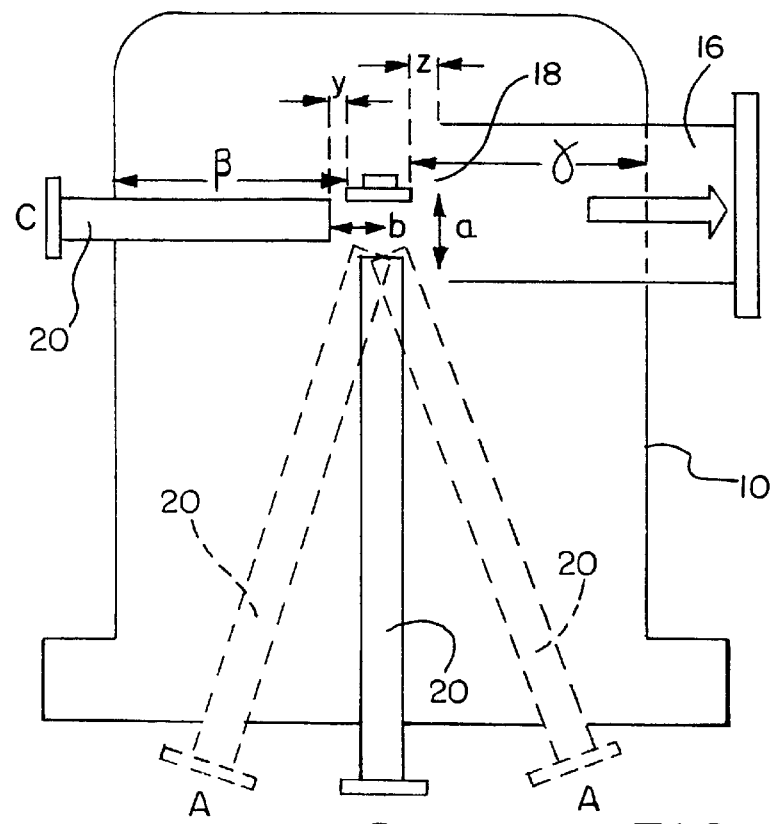
FIG. 2 is a schematic diagram showing alternative positions for a supply conduit for one of the species to be epitaxially deposited.

Referring now to FIG. 2 of the drawings, there are schematically shown alternative positions A, B and C for the first supply conduit 20. Either or both of alternative positions A may be chosen, as desired, so as to ensure that gas emerges from the outlet end 22 as close to the substrate S as possible but so that radiative heat from the substrate S does not cause excessive local heating of the inner end of the conduit 20. This might otherwise lead to decomposition of the ammonia. Position B corresponds to that described above in relation to FIG. 1 and is preferred to either of positions A since it is capable of providing the most uniform supply of ammonia across the substrate surface. The distance x for each of the positions A corresponds to that for position B.

Gas postion C is one in which the supply conduit 20 is disposed with its axis substantially parallel to the plane of epitaxial growth on the substrate S. As can be seen from FIG. 2, the outlet end 22 of the first supply conduit 20 in position C is disposed a short distance y, in this embodiment, about 20 mm (although it may be 10–80 mm), from that side edge of the substrate S which is opposite to the side edge adjacent to the vacuum outlet 18 of the vacuum chamber 10. Distance y in this embodiment is about $0.1\beta$, where $\beta$ is the distance between the adjacent wall of the vacuum chamber 10 and the relevant side edge of the substrate S. With this arrangement, ammonia is supplied as a concentrated stream across the growth surface so that it is decomposed or "cracked" on the epitaxial growth surface to form nitrogen. The positioning of the outlet 22 of the first supply conduit 20 so that it faces the vacuum outlet 18 from the chamber 10 with the epitaxial growth surface therebetween allows a high vapour pressure of ammonia to pass over the growth surface without degrading the ultra-high vacuum conditions within the chamber 10.

By providing a high vapour pressure in the locality of the epitaxial growth surface, the risk of corrosion of components of the apparatus by the ammonia is also minimised.

As can be seen from FIG. 2, movement of the first supply conduit 20 in the directions indicated by double headed arrow a may be effected when the conduit is in either of positions A or in position B, whilst movement of the first supply conduit 20 in the directions indicated by double headed arrow b may be effected when the first supply conduit 20 is in position C. Such movement of the first supply conduit 20 may be effected at any stage during the epitaxial growth period so as to maintain the desired flux of ammonia at the epitaxial growth surface. Movement of the first supply conduit 20 to a position in which it does not inhibit flow of Ga or other elemental species involved in the epitaxial growth process to the substrate S, may also be effected.

The provision of an ultra-high vacuum growth environment within the chamber, despite the existence of a high ammonia flux in the immediate in the vicinity of the epitaxial growth surface, allows the use of conventional molecular beam epitaxy equipment, such as effusion cells, hot filament gauges and conventional in-situ monitoring equipment, eg a mass spectrometer for residual gas analysis and reflection high energy electron diffraction (RHEED) equipment for examination of the substrate and epitaxial film quality. As in conventional molecular beam epitaxy, the required composition of the epitaxial growth layer can be varied, interalia, either via the temperature of the or each effusion cell 24, 26 or by the aperture of the associated shutter.

What is claimed is:

1. A method of growing a layer of Group III nitride material on a substrate by molecular beam epitaxy, comprising the steps of:

(i) disposing a substrate in a vacuum chamber;

(ii) reducing the pressure in the vacuum chamber to a pressure suitable for epitaxial growth by molecular beam epitaxy;

(iii) supplying ammonia through an outlet of a first supply conduit into the vacuum chamber so that the ammonia flows towards the substrate; and (iv) supplying a Group III element in elemental form through an outlet of a second supply conduit into the vacuum chamber so that said Group III element flows towards the substrate, whereby to cause a layer containing a Group III nitride to be grown on the substrate by molecular beam epitaxy;

wherein the outlet of the first supply conduit is disposed nearer to the substrate than the outlet of the second supply conduit.

2. A method as claimed in claim 1, wherein the pressure is reduced via at least one exhaust outlet which is disposed between the substrate and an adjacent wall of the vacuum chamber and which is spaced from the adjacent wall.

3. A method as claimed in claim 1, wherein the ammonia is discharged through the outlet of the first supply conduit in a direction which is transverse to a surface of the substrate on which epitaxial growth is taking place.

4. A method as claimed in claim 3, wherein the outlet of the first supply conduit is spaced form the surface of the substrate by a distance x such that $0.1\alpha < x < 0.7\alpha$, where $\alpha$ is a distance between the surface of the substrate and the outlet of the second supply conduit.

5. A method as claimed in claim 4, wherein $0.2\alpha < x < 0.5\alpha$.

6. A method as claimed in claim 4, wherein x is about $0.4\alpha$.

7. A method as claimed in claim 1, wherein the ammonia through the outlet of the first supply conduit is discharged across a surface of the substrate upon which epitaxial growth is taking place.

8. A method as claimed in claim 7, wherein the outlet of the first supply conduit is disposed adjacent a side edge of the substrate.

9. A method as claimed in claim 8, wherein the outlet of the first supply conduit is spaced from said side edge of the substrate by a distance y such that $0.0\beta < y < 0.7\beta$, where $\beta$ is a distance between said side edge of the substrate and an adjacent wall of the vacuum chamber.

10. A method as claimed in claim 9, wherein $0.1\beta < y < 0.3\beta$.

11. A method as claimed in claim 9, wherein y is about $0.1\beta$.

12. A method as claimed in claim 2, wherein a distance z between the exhaust outlet and a side edge of the substrate is such that $0.0\gamma < z < 1.0\gamma$, where $\gamma$ is a distance between said side edge of the substrate and the adjacent wall of the vacuum chamber.

13. A method as claimed in claim 12, wherein $0.1\gamma < z < 0.3\gamma$.

14. A method as claimed in claim 12, wherein z is about $0.1\gamma$.

15. A method as claimed in claim 1, wherein the outlet of the first supply conduit is adjustable so that a distance between the outlet of the first supply conduit and the substrate can be adjusted before or during an epitaxial growth period.

* * * * *